United States Patent [19]

Erskine et al.

[11] 4,017,312

[45] Apr. 12, 1977

[54] METHOD OF MANUFACTURING AN ARTICLE CARRYING A RELIEF IMAGE RECEPTOR MATERIAL COMPRISING EXPOSURE AND HEATING STEPS

[75] Inventors: William Erskine, Grand-Lancy; Raymond Gerber, Moillesulaz; Francis Mentienne, Carouge, all of Switzerland

[73] Assignees: Mitsubishi Plastics Industries, Limited, Tokyo, Japan; Battelle Memorial Institute, Geneva, Switzerland

[22] Filed: Dec. 19, 1975

[21] Appl. No.: 642,552

[30] Foreign Application Priority Data

Dec. 23, 1974 Switzerland ............. 17218/74

[52] U.S. Cl. .................... 96/35; 96/35.1; 96/48 HD; 101/456; 101/457; 101/463
[51] Int. Cl.² ............. G03C 5/00; G03C 5/24
[58] Field of Search ........... 96/35, 35.1, 48 HD, 96/36.3; 101/456, 457, 463

[56] References Cited

UNITED STATES PATENTS

| | | | |
|---|---|---|---|
| 1,954,325 | 4/1934 | Martinez | 96/35 |
| 2,709,654 | 5/1955 | Guth | 96/35 |
| 2,825,282 | 3/1958 | Gergen et al. | 96/35 |
| 2,911,299 | 11/1959 | Baril et al. | 96/35 X |
| 3,093,478 | 6/1963 | Peterson et al. | 96/35 |
| 3,523,791 | 8/1970 | Urancken et al. | 96/35 X |
| 3,679,414 | 7/1972 | Mukherjee | 96/48 HD |
| 3,694,208 | 9/1972 | Ranz et al. | 96/48 HD |
| 3,697,274 | 10/1972 | Herrmann | 96/48 HD |

Primary Examiner—Edward C. Kimlin
Attorney, Agent, or Firm—Oblon, Fisher, Spivak, McClelland & Maier

[57] ABSTRACT

A method of manufacturing an article carrying a relief image intended for printing comprises exposing to an appropriate activating radiation the surface of a receptor material having at least a part of its thickness from the surface thereof formed of a homogeneous mixture of a solid material whose aptitude for softening when heated is modified when it is exposed to said activating radiation, and of at least one substance which releases a gas upon being heated, in such a manner as to transcribe therein a latent image in the form of differences in aptitude for softening and by heating the receptor material to a temperature such that its exposed parts and its non-exposed parts are softened to different degrees, said temperature being at least equal to that at which said substance releases said gas, thereby causing swelling of the exposed parts and the non-exposed parts to different heights thereby forming a relief image based on differential capacity for softening.

9 Claims, 11 Drawing Figures

METHOD OF MANUFACTURING AN ARTICLE CARRYING A RELIEF IMAGE RECEPTOR MATERIAL COMPRISING EXPOSURE AND HEATING STEPS

BACKGROUND OF THE INVENTION

1. Field of the Invention

This invention relates to a method of manufacturing an article carrying a relief image, receptor material for use therein and article obtained.

2. Description of the Prior Art

The continuously growing need for ensuring the circulation and diffusion of an ever-increasing enormous mass of information of all sorts explains the considerable advance which duplication techniques are undergoing at the present time.

One of the techniques most widespread today for reproducing documents in multiple copies consists in inking and pressing repeatedly against the materials to be printed, matrices on which relief patterns representing the documents to be reproduced have been previously shaped. The preparation of such matrices has heretofore been achieved mechanically, with the help of typewriters, or of other mechanical means capable of indenting a pressure-sensitive material. In spite of the progress made in the preparation of offset plates, relief printing plates are still mostly prepared either from molten metal or, more recently, from photopolymers. The latter technique for preparing printing surfaces, which consists in photographically forming a latent image in a photopolymerizable layer — irradiating this layer with actinic light across a negative film, so as to provoke hardening of the irradiated parts — then chemically developing this image — eliminating the non-irradiated parts by means of a suitable solvent — is particularly advantageous. Still, the necessity of having to effect this wet development process constitutes a drawback with regard to short-run duplication for office use as well as to printing plates for industrial use.

SUMMARY OF THE INVENTION

Accordingly, it is an object of the present invention to palliate this drawback by providing a proces which allows relief printing surfaces to be prepared by a dry process.

Briefly, this and other objects of this invention as will be hereinafter made clear by the ensuing discussion have been attained by providing a method of manufacturing an article carrying a relief image intended for printing which comprises exposing to an appropriate activating radiation the surface of a receptor material having at least a part of its thickness from the surface thereof formed of a homogeneous mixture of a solid material whose aptitude for softening when heated is modified when it is exposed to said activating radiation, and of at least one substance which releases a gas upon being heated, in such a manner as to transcribe therein a latent image in the form of differences in aptitude for softening and by heating the receptor material to a temperature such that its exposed parts and its non-exposed parts, are softened to different degrees, said temperature being at least equal to that at which said substance releases said gas, thereby causing swelling of the exposed parts and the non-exposed parts to different heights thereby forming a relief image based on diferential capacity for softening.

The present invention likewise includes a receptor material for carrying out this method, which is characterized in that at least a part of its thickness, from the surface thereof, is formed of a homogeneous mixture of a solid material whose aptitude for softening by heating will be modified under the effect of irradiation by an activating radiation, and of at least one substance which releases gas upon being heated.

The present invention also provides an article obtained by carrying out this method.

BRIEF DESCRIPTION OF THE DRAWINGS

A more complete appreciation of the invention and many of the attendant advantages thereof will be readily attained as the same becomes better understood by reference to the following detailed description when considered in connection with the accompanying drawings, wherein.

DETAILED DESCRIPTION OF THE PREFERRED EMBODIMENT

Figure 1:
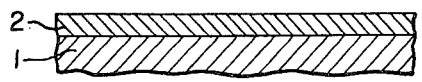
FIGS. 1 to 6 are fragmentary sections of one embodiment of the present invention.

From the above summary, it can be seen that the receptor material of this invention is comprised of two components. The first consists of a compound whose capacity for softening will be changed when the material is exposed to proper activating radiation. That is, the softening point of this material will change (upward or downward) when it is irradiated. Upon being irradiated through a suitable mask, such as a photograhic negative, only certain areas of the receptor surface will receive light. The molecules located in these areas only will undergo a change in softening point. As a result, a latent image will be formed, wherein the irradiated areas will have a different softening point from that of the non-irradiated areas. If the receptor material is subsequently heated to a temperature between these softening points only one of these classes of molecules will be substantially softened, i.e., that set with the lower softening point. Thus, one requirement for the compounds suitable for use as the first component of the receptor surface is that the softening point thereof must change sufficiently so that when heated the two above-described sets of molecules will be softened to different degrees.

The second component of the receptor surface consists of a conventional compound(s) which will give off a gas when heated to a temperature between the two softening points discussed above. In this way, the softened areas of the receptor will swell while the unsoftened or less softened areas will not swell or will swell to a lesser degree. The difference in this swelling height forms a relief image of the mask used to irradiate the receptor. This difference in height is not critical but must be chosen in accordance with the requirements of the subsequent conventional printing process wherein the receptor image is to be used. Thus, it can be seen that a basic requirement for the first compound is that the change in softening capacity be sufficient to produce a swelling height difference when heated which is compatible with conventional printing process requirements, i.e., which is suitable for use as a relief image for printing processes. On the other hand, a basic requirement for the second component is that it release gas in amounts sufficient to cause swelling of the molecules with the lower softening point when the receptor material is heated to a temperature above this softening point but below that of the higher temperature softening molecules.

The relative amounts of these components to be used are not critical so long as the intended effects are achieved. That is, the amount of gas-releasing component need only be that amount which is sufficient to release enough gas to cause the desired amount of swelling in the softened component, i.e., sufficient to form the desired relief image. The minimum amount of the component whose softening capability changes upon irradiation, of course, is that amount sufficient to achieve the desired final relief height difference.

Figure 8:
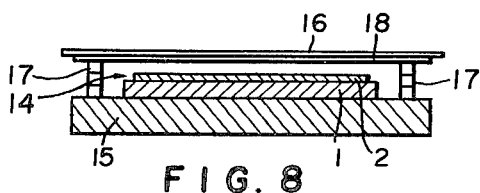
FIG. 8 is a sectional view of a device for carrying out the stage illustrated in FIG. 7.

Choice of the various parameters for the components is not critical except for those necessary properties discussed above. For example, as shown below, the two components can be selected to potentially achieve a very large relief height. The desired height for any application can then be achieved by utilizing a top plate such as shown in FIG. 8 and fully discussed below.

In the present description, the generic term "activating radiation" includes all radiation capable of bringing about or promoting the chemical reactions and/or changes in the physical properties of the materials used in this invention as described below. Such radiations include for example actinic radiations (electromagnet radiations capable of starting chemical reactions) such as X-rays or gamma rays; radiations with lower energy, although strongly actinic, such as ultra-violet radiations; slightly actinic radiations of the visible part of the electromagnetic spectrum as well as infrared radiations; particular high-energy emissions, especially alpha rays, beams of electrons, neutrons, ions, and the like. Dosages of from $10^2$ to $10^9$ rads may in general be used. Radiation intensities, dosages and exposure times can easily be selected according to conventional considerations for irradiating the radiation sensitive compounds used.

The term "thermoplasticity" is utilized in another connection in the present description to designate the aptitude, or the capacity which a determined material exhibits for softening under the action of heat, whether or not this softening is followed by rehardening during cooling. The meaning given to this term is thus broader than the meaning usually derived from expressions such as "thermoplastic materials", implying the presence of a process which is necessarily reversible.

The solid material whose aptitude for softening under this action of heat, i.e., hereinafter, whose thermoplasticity is capable of undergoing modification under the influence of activating radiation may be formed of a polymerizable compound, in particular a monomer, a prepolymer or a mixture of monomers and of prepolymers. This material may likewise be formed of a polymer, or of a mixture of polymers, or of a mixture of polymers and of monomers, which are capable of undergoing, under the influence of an activating radiation, a cross-linking and/or grafting, or on the contrary, a depolymerization or a partial degradation. When it is subject to a polymerization and/or reticulation and/or grafting under the influence of an activating radiation, such a material thus has its thermoplastic characteristics diminshed while, when it is subject to a depolymerization or a partial degradation under the influence of the same activating radiation, such a material on the contrary has its thermoplastic characteristics augmented. It may be said that the modifications of thermoplasticity to which such materials are subject under the influence of an activating radiation are probably accompanied by a temperature displacement of their "softening point". It should nevertheless be made clear that the term "softening point" constitutes as far as polymers are concerned, a quite indefinite and empirical notion, which is difficult to confine within the strict limits of a precise scientific definition, and whose experimental determination suffers from a certain lack of reproducibility. Most plastic materials are indeed deformed within a determined range of temperatures, if one generally means by softening point the temperature starting from which this deformation begins to manifest itself. With the above remarks in mind, it can be expected that a decrease of the thermoplasticity characteristics must be accompanied, for the material considered, by a displacement of its softening point towards higher temperature values, while on the contrary, an increase of the thermoplasticity characteristics must probably be accompanied by a lowering of its softening point.

This solid material whose thermoplasticity is susceptible of undergoing modifications under the effect of an activating radiation may of itself be photosensitive, the transformations in question then resulting from its properties of photosensitivity. This material may, on the contrary, not be, or be only slightly, photosensitive, and one may then bring about the above-mentioned transformations by addition of known photo-sensitizers to this material. As materials capable of undergoing reticulation under the effect of an activating radiation, one may utilize, in particular, the following substances: polystyrene, polyisoprene, polyvinyl chloride, polyvinyl alcohol or poly(vinyl cinamate). One may likewise utilize photocrosslinkable substances such as photoresists, which lend themselves particularly well to the described application. One may in particular use the following photoresists: polyisoprene, polyvinyl cinamate, cyclic cis-polyisoprene, carboxymethyl ether deformaldehyde, phenol formaldehyde, or maleic anhydride vinyl ether copolymer. As substances susceptible of undergoing grafting under the influence of an activating radiation, one may in particular use the following substances: polyethylene, polypropylene, polyisobutylene, polystyrene, polyamide, polyacrylonitrile, natural rubber, cellulose and derivatives. As substances susceptible of undergoing a depolymerization or particle degradation, under the action of an activating radiation, one may in particular use the following substances: polyisobulylene, methyl polymethylacrylate, or polymethylacrylnitrile.

The substance or swelling agent capable of releasing a gas when heated to a temperature at least equal to a predetermined temperature — generally called its decomposition temperature — is preferably chosen so as to have a decomposition temperature above the ambient temperature. One may in particular use as swelling agents chemical compounds having the general formula $R_1—CO—R_1'$ or $R_2—SO_2—R_2'$ or else $R_3—N_3$, wherein $R_1$, $R_1'$, $R_2$, $R_2'$ and $R_3$ are aryl or heterocyclic groups. As swelling agents capable of giving off nitrogen by heating, one may utilize in particular the following substances: azodicarbonamide, '-azoisobutyronitrile, diazomino-benzene, azocyclohexylnitrile. By way of another example, one may further use N,N'-dimethyl-N,N'-dinitrosoter ephthalamide, whose decomposition temperature is 108° C.

The conditions to be used in applying the method of the present invention — the respective proportions of the elements in the composition of the homogeneous mixture constituting the layer, the thickness of this layer, the nature of the support, the temperature and duration of development, and the choice of the hardening process — are interdependent. Suitable conditions may readily be determined by prior simple experimentation by a person skilled in the art. In this respect, it is to be noted that the present invention employs well known characteristics of certain compounds in a completely usual manner. That is, compounds whose capacity for softening when heated are changed by exposure to radiation are well known. Similarly, compounds which release gases upon irradiation are known as is the technology of using these compounds. With the abundance of information in these areas, no undue experimentation is required to obtain the desired effects of this invention when the materials are used in accordance with this specification.

Referring to the figures, the different stages of several embodiments of this invention will be discussed.

The initial receptor material represented in FIG. 1 consists of a plane support 1 coated with a layer 2 of uniform thickness formed of a homogeneous mixture of a solid material susceptible of undergoing, under the effect of an irradiation by an activating radiation, a polymerization and/or cross-linking and/or grafting bringing about a decrease of its characteristics of thermoplasticity, and of a swelling agent capable of releasing a gas when it is heated above a determined temperature.

Figure 2:
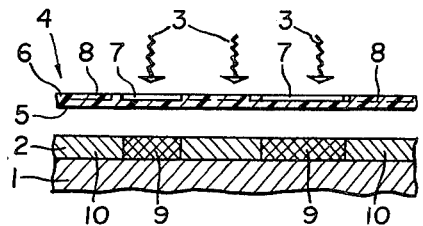

This sensitive layer 2 is first subjected (FIG. 2) to irradiation by an activating radiation 3, across a positive photographic film 4 formed of a transparent support 5 carrying a positive image 6 composed of transparent areas 7 and opaque areas 8 (whereof a fraction only is visible in the drawing). Arrival of this activating radiation 3 on the parts 9 of the layer 2 which are situated below the transparent areas 7 of the film 4 has the effect, by causing therein a polymerization and/or crosslinking and/or grafting, of bringing about a decrease of the characteristics of themoplasticity of these parts 9, which process is probably accompanied by a displacement of their softening point towards higher temperature values. The parts 10 of the layer 2 situated below the opaque areas 8 of the film 4 do not, on the other hand, undergo any modification. The duration of the irradiation is both a function of the thickness of the layer 2 and of the intensity of the activating radiation 3. At the end of irradiation, there is thus transcribed in the layer 2 a latent image in the form of zones which possess different characteristics of thermoplasticity.

Figure 3:
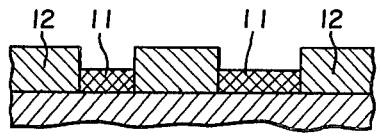

The latent image thus formed is developed (FIG. 3) by heating this layer 2. This development temperature should be chosen so that it brings about notable softening of the non-irradiated parts 10 without, however, appreciably modifying the hardness of the irradiated parts 9. Since the development temperature is also chosen to be at least equal to the decomposition temperature of the swelling agent present in the layer 2, the gas thus released by the decomposition of the swelling agent has the effect of bringing about a swelling in height of the softened parts 10 while exerting practically no effect on the hard parts 9. The elements constituting the layer 2 of course must be previously chosen in such a manner that they may conjointly obey to these various temperature conditions. In spite of both the lack of precision discussed above which surrounds the notion of this softening point, and the difficulty with which one is faced in experimentally revealing a temperature displacement of this softening point under the effect of irradiation, it is nevertheless possible to choose a development temperature which is situated between the lowest softening point of the layer, i.e. the softening point of the non-irradiated parts, and the highest softening point, i.e. that of the irradiated parts. This is evidenced by the results obtained in the Examples below. The duration of the thermal treatment is chosen so as to create an adequate swelling height, corresponding to the subsequent printing of an image of good quality. This duration of treatment is a function both of the thickness of the photosensitive layer and of the temperature of treatment. One thus obtains at the end of the thermal development (FIG. 3) a material provided with hollow parts 11 and parts 12 in relief whereof the overall distribution is characteristic of the positive image 6 which has served as a mask during irradiation.

Figure 7:
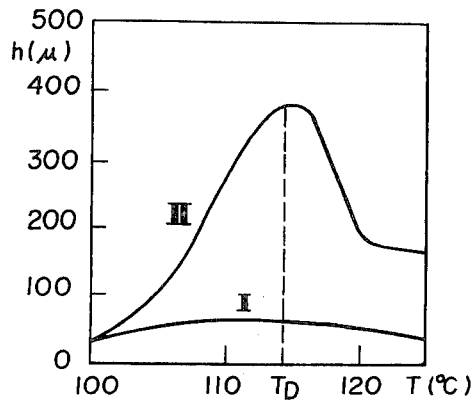
FIG. 7 is a diagram relating to a physical phenomenon observed during one of the essential stages of the method.

The swelling process observed during this development phase is illustrated by the diagram of FIG. 7, which represents the variations as a function of temperature of the respective heights $h$ [expressed in micrometers ($\mu$m)] of the irradiated parts (curve I) and the non-irradiated parts (curve II), for a layer with an initial height of 50 micrometers, consisting of a homogeneous mixture of 60% by weight of a polymer of isoprene (product commercially known under the name of K.M.E.R.) and of 40% by weight of N-N'-dimethyl-N-N'-dinitrosoterephthalamide. It may clearly be seen in this diagram that it is particularly advantageous to choose the development temperature $T_D$ within the zone corresponding to the most marked differences in height. Of course, this development temperature $T_D$ must likewise be chosen superior to the decomposition temperature $T_c$ of the swelling agent.

To effect the thermal development, one may advantageously utilize the assembly shown in FIG. 8, with the object of controlling the degree of swelling and of ensuring the formation of reliefs with plane tops. After irradiation, the receptor material 14, formed of the support 1 coated with the sensitive layer 2, is placed on a copper plate 15 coated with a thin silver layer. A thin glass plate 16 is maintained at a uniform distance from the sensitive layer of the receptor material 14 by chocks 17. The whole is introduced into an oven (not shown) maintained at constant temperature, the receptor material 14 being heated in a regular manner over its entire surface by the copper plate 15. The interval separating the glass plate from the sensitive layer 2 is chosen so as to be inferior to the maximum swelling so that the various parts which undergo swelling all come to abut against this glass plate 16. In this way one obtains a uniform swelling height as well as plane tops, which are essential conditions for subsequently obtaining printing of good quality. In order to avoid possible sticking of the swelled parts against the glass plate 16, one may, before heating, dispose against the surface of the plate 16 situated facing the sensitive layer 2, a film of mylar 18 which may easily be removed afterwards. As a variant, one may do away with the chocks 17 and directly place the glass plate 16 on the sensitive layer, which will act as a counter-weight during swelling.

Figure 4:
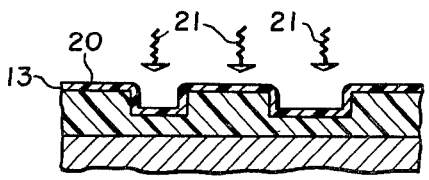
Figure 5:
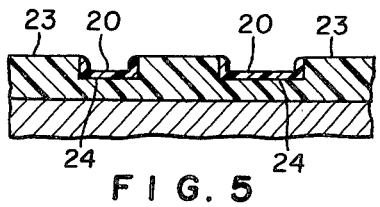
Figure 6:
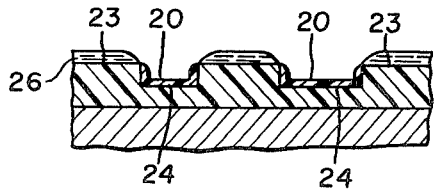

After thermal development, the material thus obtained may be subjected to various treatments designed to harden it and to improve its mechanical resistance. One may for example deposit on the surface of this material (FIG. 4) a thin film 20 of a substance capable of hardening it. One may next subject the material thus coated (FIG. 4) to a post-irradiation by ultraviolet radiation 21, in order to further improve the hardness characteristics thereof. In the case where the film 20 should not be transparent, one may obviously effect the post-irradiation prior to depositing this film 20. A particularly advantageous solution consists in depositing on the entire surface of the material of film 20 of a substance endowed at the same time with properties allowing it to harden the said material and with properties allowing it to repel printing inks. Then, this deposition can be followed by a precision polishing (FIG. 5) designed to take off this film 20 from the top of the parts in relief 23, the said film nevertheless, remaining in the hollow parts 24. One may, for example, use as substances endowed with such a property, varnishes such as the varnish known by the name of "Letrased 101 dry transfer product" which may be deposited by spraying. The material, thus obtained is then ready for printing proper, and may be incorporated in known printing devices, by mounting on a printing cylinder for example. The surface of this material (FIG. 6) is coated with a relatively viscous ink 26, which is fixed on the naked parts in relief 23 while being repelled by the hollow parts 24 covered with the varnish 20, whereby printing of the desired number of copies can proceed.

Figure 9:
FIGS. 9 to 11 are fragmentary sectional views of another embodiment.
Figure 10:
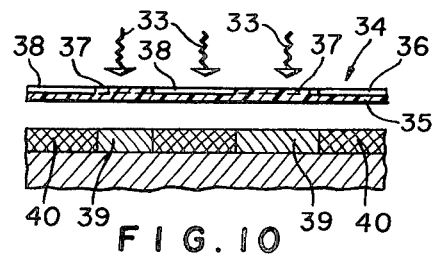
Figure 11:
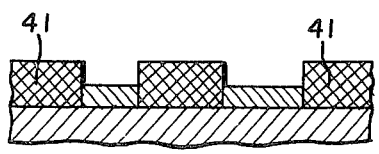

The variant represented in FIG. 9 to 11 differs essentially from the embodiment represented in FIG. 1 to 8 by the nature of the mixture constituting the photosensitive layer as well as by the choice of the mask to be utilized during irradiation. The initial receptor material (FIG. 9) consists of a plane support 31 coated with a layer 32 of uniform thickness, formed of a homogeneous mixture of a solid material susceptible to undergo, under the effect of an activating radiation, a depolymerization or a partial degradation capable of bringing about an increase of its thermoplasticity characteristics and also of a swelling agent capable of releasing gas by heating above a determined temperature. The irradiating operation (FIG. 10) consists in exposing this layer 32 to an activating radiation 33, across a negative film 34 formed of a transparent support 35 carrying a negative image 36 composed of transparent areas 38 and opaque areas 37. The activating radiation 33 has the effect of increasing the characteristics of thermoplasticity of the parts 40 of the layer 2 situated below the transparent areas 38 of the film 34, by bringing about thereon a depolymerization or a partial degradation — which will probably bring about a displacement of the softening point of these parts 40 towards temperature values. It exerts practically no action on the parts 39 of the layer 2 situated below the opaque areas 37 of the film 34.

The thermal treatment which is next applied (FIG. 11) to this layer 32 carrying a latent image, causes a notable softening of the irradiated parts 40 without however appreciably modifying the hardness of the non-irradiated parts 39. Due to the gas released in this layer 32 by the same thermal treatment, a swelling in height of these irradiated parts 40 ensues so that the latent image transcribed in the layer 32 by irradiation is materialized in the course of the thermal treatment in the form of a relief image 41. The treatments to which this relief image 41 is next subjected with a view to improving its mechanical resistance are analogous to those described above. At the end of the treatment, this hardened relief image may then be utilized for printing.

The manufacture of the receptor material serving to carry out the method according to this invention must be effected with very particular care. As the case may be, the whole thickness of the receptor material or only a part of this thickness may be formed of the homogeneous mixture. In this second case the rest of the thickness may be formed of a support which may be, for example, a polyethylene film or an aluminium sheet. The presence on the support of a layer of constant thickness of a perfectly homogeneous mixture is an essential condition for obtaining uniform swelling during development.

Homogenisation of this mixture and coating of it onto the support may be effected in different ways. In order to obtain a uniform dispersion of the swelling agent in the material sensitive to activating radiation, one may for example introduce these two constituents in appropriate proportions into a receptacle containing stainless steel balls, and proceed to agitate the whole together by known means. To next apply onto the support a constant thickness of the homogeneous mixture thus obtained, one may for example utilize the "rotating disk method", the thickness obtained being a function of both the viscosity of the mixture and the speed of rotation of the disk. The coating may consist of a deposit in a single layer, or on the contrary of a deposit of several successive layers. The thickness of this coating may preferably lie between 50 and 150 micrometers. The thickness of the optional support which also preferably lies between 50 and 150 micrometers, depends on the desired manner of utilizing the receptor material and on the desired mechanical resistance. The general form of the receptor material may be varied. Thus, the material may be, for exmaple, of generally flat shape, in particular, in the form of flexible or rigid sheets, of ribbons or of sheets wound around the outer or inner surface of a cylindrical drum.

Having generally described the invention, a more complete understanding can be obtained by reference to certain specific examples, which are included for purposes of illustration only and are not intended to be limiting uless otherwise specified.

EXAMPLE 1

A receptor material sensitive to the action of ultraviolet radiation was prepared. It displayed the following characteristics.

support: polyethylene sheet with a thickness of 100 to 125 micrometers layer sensitive to the action of ultraviolet radiation: (thickness: 120 micrometers) formed of a suspension of 40% by weight of N'N'-dimethyl-N'N'-dimitrosoterephthalamide (known, e.g., by the commercial name of NITROSAN) in a polymer of isoprene (product commercially known by the name of K.M.E.R., initials of KODAK METAL ETCH RESIST, and fabricated by the EASTMAN KODAK COMPANY.)

The fabrication was accomplished as follows:

Under energetic agitation (for a duration of about 72 hours), a mixture composed of 40% by weight of Nitrosan and of 60% by weight of K.M.E.R. admixed in its commercial form with xylene as solvent (the percentages were calculated based on the weight of dry K.M.E.R.) was dispersed. Prior to deposition, the plastic support was prepared. To this end, a plastic sheet was carefully cleaned with a solvent (acetone for example) so as to cause any trace of oil or grease to disappear. The surface of this sheet next treated during 5 to 10 minutes with a solution of a mixture of chromic and sulphuric acid destined to improve subsequent adherence of the sensitive layer. This surface was then washed so as to remove any residues which may possibly have been left by the chemical treatment, and the support was heated during 10 minutes at about 50° C so as to dry it and then left to cool to ambient temperature. Immediately before deposition, there was added to the obtained dispersion, in a proportion of about 1% by weight, a tensio-active agent commercially known by the name of L-520 surfactant (manufactured by the UNION CARBIDE COMPANY). The cooled support was then placed on the plate of a rotating disc, the dispersion spread onto the support and the disc made to rotate at 78 r.p.m. during about 15 minutes so as to obtain a layer of uniform thickness. The material thus obtained was next heated during 15 – 30 minutes to 70° C (according to the thickness of the layer) so as to eliminate any trace of solvent from the layer. This material was next subjected to irradiation by means of a mercury vapour lamp (power 200 W) during 10 minutes, with insertion of a mask formed of a photographic positive disposed parallel to the surface of the material, between the latter and the radiation source. During the entire irradiation, a stream of cool air was flowed on the surface of the sensitive layer so as to prevent heating thereof. After irradiation the surface of the material was uniformly heated during 10 minutes to 110° C. The parts of the material completely protected from irradiation by the opaque areas of the positive swelled up to a height of about 350 micrometers, while the parts irradiated across the transparent areas of the positive practically did not swell. A relief was thus obtained representing the photographic positive.

This material was then subjected to a second irradiation applied uniformly to the whole surface during 5 to 10 minutes, by means of a mercury lamp of 125 W, so as to increase the hardness of the swollen parts. This material was mounted around a printing cylinder, inked with a particular offset ink (commercially known by the name of GESTETNER No. 210) diluted in a proportion of 55% by weight in a solvent commercially known by the name of "Printing Ink Distillate-Grade 300/320" (manufactured by the BUTLER CHEMICALS COMPANY), and was pressed against an offset paper of a current type. The printed image thus obtained was of good quality.

EXAMPLE 2

A receptor material which was analogous to that described in Example 1 was prepared but with the sensitive layer thereof having a thickness of 80 instead of 120 micrometers. This material was next subjected to an irradiation analagous to that described in Example 1, the duration of the irradiation being 5 minutes instead of 10 minutes. The surface of the material was uniformly heated during 5 minutes to 110° C instead of 10 minutes. The non-irradiated parts of the material swelled up to a height of about 200 micrometers, while the irradiated parts practically did not swell. This material was then subjected to a second irradiation analagous to that described in Example 1 and the printing operation was effected in the same manner as in Example 1. The image obtained after inking and pressing this material against an offset paper of current type was of good quality.

EXAMPLE 3

A receptor material identical with that described in Example 1 was prepared. This material was next subjected to a first irradiation and to a thermal treatment identical with those described in Example 1. Before proceeding to the second irradiation, there was sprayed onto the whole surface of this material a thin transparent layer of a cellulose varnish (for example known commercially by the name of "LETRASET 101 DRY TRANSFER PRODUCT"). Once dry, this fine layer of varnish improved the hardness of the parts in relief. This material covered with varnish was subjected to a second irradiation with a duration of 5 to 10 minutes, by means of a mercury vapour lamp of 125 W. After this second irradiation, the tops of the parts in relief were lightly rubbed with glass-paper so as to eliminate the layer of varnish from these top parts. Printing was then carried out in a manner analogous to that described in Example 1, by covering with ink the parts in relief. The varnish which remains in the hollows repelled the ink, so that the hollow parts could not participate in the printing. The image obtained was of excellent quality. This quality was altered little, even after drawing off 1,500 copies.

EXAMPLE 4

A receptor material sensitive to the action of ultraviolet radiation was prepared and displayed the following characteristics:

support: polyethylene sheet of 50 micrometers thickness layer sensitive to ultraviolet radiation (thickness 50 micrometers) formed of a suspension of 25% by weight of Nitrosan in a product commercially known by the name K.T.F.R. (initials of KODAK THIN FILM RESIST, product manufactured by the firm EASTMAN KODAK). A latent image was formed in this material by irradiation by means of a mercury vapour lamp (power 200 W) during 2 minutes, across a photographic positive. The latent image was developed by uniformly heating the surface of this material during about 2 minutes to 110° C. The irradiated parts of the material swelled to 50 micrometers, while the non-irradiated parts practically did not swell.

Having now fully described the invention, it will be apparent to one of ordinary skill in the art that many changes and modifications can be made thereto without departing from the spirit or scope of the invention as set forth herein.

What is claimed as new and desired to be secured bu U.S. Letters Patent is:

1. A method of manufacturing an article carrying a relief image suitable for use as a printing plate which comprises:
   i. image-wise exposing to appropriate actinic radiation the surface of a photosensitive receptor material having at least a portion of its thickness from the surface comprising a homogeneous mixture of:
      a. a solid material whose softening point is altered upon exposure to said actinic radiation such that the exposed and non-exposed portions of said receptor material have different softening points; and b. at least one substance which releases a gas when heated to a temperature between the softening points of said exposed portions and non-exposed portions of said receptor material;

ii. then heating the exposed receptor material to a temperature between the softening points of said exposed portions and said non-exposed portions of said receptor material, said temperature being at least equal to the temperature at which said substance releases said gas;

thereby causing the swelling of said exposed portions and said non-exposed portions to different heights to form a relief image.

2. The method of claim 1, wherein the appropriate actinic radiation is selected from the group consisting of X-rays, gamma rays, ultra-violet radiation, radiation of the visible part of the electromagnetic spectrum, infrared radiations, alpha rays, electron beams, neutrons, and ions.

3. An article carrying a relief image for printing prepared by the method of claim 1.

4. The method of clain 1 wherein after said heating, the parts of said material which have swelled the least are coated with a substance capable of repelling a printing ink.

5. The article carrying a relief image of claim 3, wherein the hollow parts of said article are coated with a substance capable of repelling a printing ink.

6. The method of claim 1, wherein said solid material of said mixture has a softening pont which is increased by irradiation with actinic radiation and wherein said heating is effected at a temperature lying between the lowest softening point and the highest softening point of the non-irradiated material.

7. The receptor material of claim 2, which further comprises a support of polyethylene coated with a layer of a homogeneous mixture of a polymer of isoprene and of N,N'-dimethyl-N,N'-dinitrosoterephthalamide.

8. The method of claim 1, wherein the change in the softening point is large enough such that when heated, said different heights of the exposed parts and the non-exposed parts will be sufficient for formation of a relief image to be used in conventional printing processes.

9. The method of claim 1, wherein the ratio of the amount of the gas-releasing component to the amount of the softening component is such that the degree of swelling of the softened component when heated is sufficient for formation of a relief image.

* * * * *